United States Patent [19]
Shimoyama et al.

[11] Patent Number: 5,872,453
[45] Date of Patent: *Feb. 16, 1999

[54] BATTERY REMAINING CAPACITY MEASURING APPARATUS

[75] Inventors: Kenichi Shimoyama; Tsutomo Saigo; Youichi Arai, all of Susono, Japan

[73] Assignee: Yazaki Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 707,759

[22] Filed: Sep. 4, 1996

[51] Int. Cl.⁶ .................................................. G01N 27/416
[52] U.S. Cl. .......................... 324/431; 320/13; 320/48; 320/35; 324/427; 324/430
[58] Field of Search ................................. 320/48, 35, 13; 324/431

[56] References Cited

U.S. PATENT DOCUMENTS

| | | | |
|---|---|---|---|
| 3,895,584 | 7/1975 | Schweizer | 320/48 |
| 5,352,968 | 10/1994 | Reni | 320/35 |
| 5,404,106 | 4/1995 | Matsuda | 324/431 |
| 5,606,242 | 2/1997 | Hull | 320/48 |
| 5,606,243 | 2/1997 | Sakai | 320/48 |
| 5,614,804 | 3/1997 | Kayano | 320/13 |

*Primary Examiner*—Josie Ballato
*Assistant Examiner*—Thomas Valone
*Attorney, Agent, or Firm*—Oblon, Spivak, McClelland, Maier & Neustadt, P.C.

[57] ABSTRACT

A battery remaining capacity measuring apparatus comprises a temperature sensor 5 and a remaining capacity operation portion 19. A temperature sensor 5 detects a temperature of a battery 3. A remaining capacity operation portion 19, wherein when a detected temperature of a battery 3 from a temperature sensor 5 is not within the range of a predetermined temperature in the state of an open circuit, a load 1 and a battery 3 which are previously obtained according to a detected temperature correct a line pattern in the state of an open circuit and when a load is connected to a battery, a remaining capacity can be obtained on the corrected line. Accordingly, it is possible to obtain a remaining capacity according to this temperature, even if a temperature of a battery 3 is not within the range of a predetermined temperature.

3 Claims, 6 Drawing Sheets

BATTERY REMAINING CAPACITY MEASURING APPARATUS

BACKGROUND OF THE INVENTION

1. Field of the Invention

The invention relates to a battery remaining capacity measuring apparatus and more particularly to a battery remaining capacity measuring apparatus according to a battery temperature.

2. Description of the Related Art

In general, since an electric car moves using a battery, it is necessary to estimate a battery remaining capacity. The followings are systems for measuring a battery remaining capacity.

(1) A system for measuring and integrating a quantity of a current provided from a load side, and estimating a remaining capacity according to the current integrated value and a quantity of a current while charging, namely, a current integrating system.

(2) A system for measuring a terminal voltage when a discharge current is applied to a load side from a battery terminal and estimating a remaining capacity, namely, a voltage detecting system.

(3) A system for measuring a specific gravity of an electrolyte in a battery and estimating a remaining capacity, namely, a specific gravity of an electrolyte system.

(4) A system for disconnecting a battery from a load, estimating a terminal voltage in the state of an open circuit and estimating a remaining capacity, namely, an open circuit voltage detecting system.

(5) A system for measuring a change of an internal resistance in a battery and estimating a remaining capacity, namely, an internal resistance measuring system.

As described above, there are some systems for measuring a remaining capacity and so on.

For example, according to a voltage detecting system as described in (2), in general, a full-charged voltage $V_F$ corresponding to a capacity (100%) on full-charging and a voltage $V_E$ (as refereed to a voltage when a remaining capacity is 0% below) when a capacity of a battery is 0% are previously set. An initial voltage (for example, a voltage when full-charging) while disconnecting a load is detected. According to the initial voltage, a remaining capacity voltage is estimated after this.

For example, if a detected voltage (refereed to as an estimate voltage $V_N$ below) becomes a full charged voltage $V_F$, a display is that 100% of a remaining capacity remains. While, if an estimate voltage $V_N$ becomes a voltage $V_E$ when a remaining capacity is 0%, a display is that 0% of a remaining capacity remains.

However, a battery voltage is inclined to decrease as a temperature drops.

Thus, as shown in FIG. 1, according to a relationship between a battery capacity and an estimate voltage $V_N$, an estimate voltage $V_N$ is below a predetermined full-charged voltage $V_F$, even if 100% of a battery capacity remains actually. While, even if 100% of a battery capacity remains, a display is that less than 100% of a battery capacity remains.

Furthermore, a remaining capacity voltage is estimated according to an initial voltage and a detected voltage. Accordingly, when a temperature drops, even if a battery capacity does not remain, an estimate voltage $V_N$ is more than a voltage $V_E$ of when 0% of remaining capacity remains. A display is that more than 0% of a battery capacity remains.

While, when a temperature is high, a battery voltage is inclined to get higher.

Thus, as shown in FIG. 2, even if less than 100% of battery capacity remains actually, an estimate voltage $V_N$ is more than a full-charged voltage $V_F$, and a display is that a remaining capacity is 100%.

Furthermore, a remaining capacity voltage is estimated according to an initial voltage and a detected voltage. Accordingly, when a temperature goes up, even if a battery capacity still remains, an estimate voltage $V_N$ is a voltage $V_E$ of when a remaining capacity is 0%. A display is that 0% of a battery capacity remains.

That is, since a battery voltage changes according to a temperature, it is necessary to correct a battery temperature so that a correct remaining capacity can be obtained.

By the way, a battery temperature changes due to various causes, and a discharge characteristic differs as a temperature changes.

In general, it is necessary to obtain a predetermined number of temperature data, voltage data, current data and so on, to use a method of least squares and so on, to find a preferable temperature correcting coefficient, and to correct an estimate capacity voltage. Accordingly, a program configuration of an apparatus is complicated.

That is, the problem is that it is not easy to correct an estimate capacity voltage according to a battery temperature and to find a correct remaining capacity.

SUMMARY OF THE INVENTION

It is an object of the present invention to provide a battery remaining capacity measuring apparatus which supplies a correct remaining capacity voltage easily.

According to a first aspect of the invention, a battery remaining capacity measuring apparatus for detecting a battery voltage as a maximum voltage of an actual battery after a predetermined time in an open circuit of a load and a battery, for obtaining a minimum voltage until no remaining capacity remains according to the maximum voltage, and for creating a line pattern connecting both of voltage values, comprises a temperature sensor for detecting the battery temperature; and a remaining capacity operation portion correcting the line pattern is corrected according to the detected temperature when a detected temperature of a battery from the temperature sensor is not within the range of a predetermined temperature in the open circuit of the load and a battery, and obtaining a remaining capacity on the detected line pattern in a closed circuit of the load and the battery. Accordingly, a line pattern can be obtained according to the detected temperature and it is possible to obtain a remaining capacity on this line pattern.

According to a second aspect of the invention, the remaining capacity operation portion comprises a temperature discrimination means for discriminating whether the detected temperature is more than or less than the range of a predetermined temperature in a state of the open circuit; a voltage estimate means for taking the battery voltage and a current from a battery for every predetermined time while in a state of a closed circuit of the load and the battery, for obtaining an approximate line by a method of least squares, and for estimating an actual battery voltage from the approximate line; a remaining capacity calculation means for creating a line pattern connecting both of voltage values according to predetermined the maximum voltage and the minimum voltage in a state of the open circuit, for locating the estimate voltage on the corrected line pattern in a state of the closed circuit, and obtaining a remaining capacity; a high pattern calculation means for reading the maximum voltage which is set in the remaining capacity calculation means when the detected temperature is decided to be out of the range of a predetermined temperature, for adding a corrected value of a maximum voltage at a high temperature to the maximum voltage in order to change a previous setting, together with for reading the minimum voltage which is previously set, and for subtracting a corrected value of a minimum voltage at a high temperature from the minimum voltage in order to change a previous setting. Accordingly, it is possible to obtain a line pattern having a tendency that a battery voltage gets higher when a battery temperature gets higher.

According to a third aspect of the invention, the remaining capacity operation portion, comprises a low temperature calculation means for reading the maximum voltage which is set in the remaining capacity calculation means when the detected temperature is decided to be within the range of a predetermined temperature, for subtracting a corrected value of a maximum voltage at a low temperature from the maximum voltage in order to change a setting, together with for reading the minimum voltage which is set, and for adding a corrected value of a minimum voltage at a low temperature from the minimum voltage in order to change a setting. Accordingly, it is possible to obtain a line pattern having a tendency that a battery voltage gets lower when a battery temperature gets lower.

According to a fourth aspect of the invention, the remaining capacity calculation means locates the estimate voltage on a line pattern, and subtractes a remaining capacity having the estimate voltage and a minimum voltage from a remaining capacity between a maximum voltage of the line pattern and a minimum voltage in order to obtain a battery remaining capacity. Accordingly, it is possible to easily obtain a battery remaining capacity.

DETAILED DESCRIPTION OF THE PREFERRED EMBODIMENTS

An embodiment of the present invention will be described hereinafter with reference to the accompanying drawings.

In a case of measuring a battery remaining capacity installed on an electric car, as an example of using a battery remaining capacity measuring apparatus according to the invention, an open circuit means the state of a load which is not connected to a battery. An electric car always does not start running and does not stop running in the state of a full-charging. In general, in a preferable embodiment, a maximum voltage is a battery terminal voltage after a predetermined time from when an electric car stops running and a load is not connected to a battery. The explanation will be further understood from an example in the state of full-charging.

Figure 1:
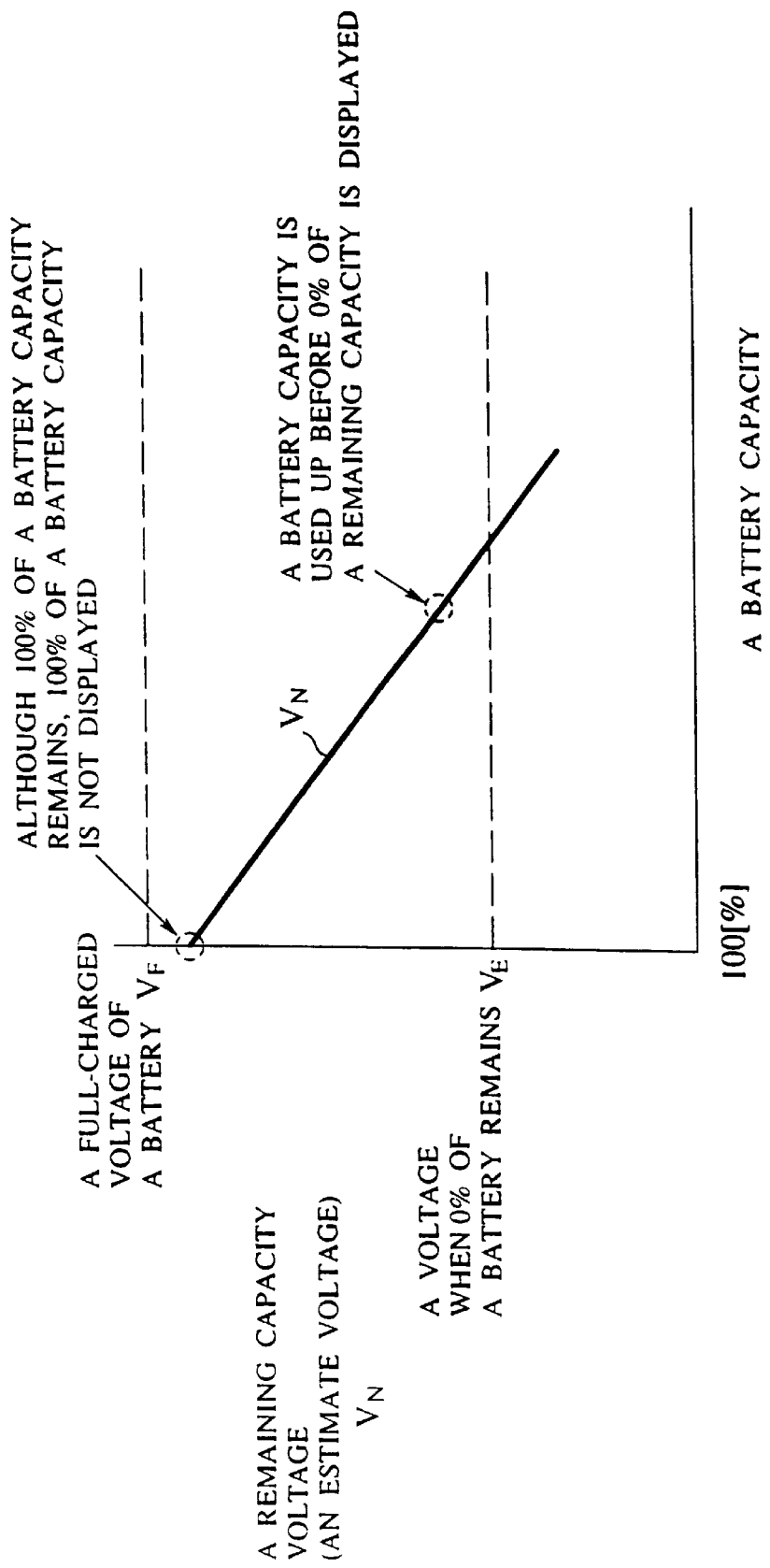
FIG. 1 is a diagram showing the problems of a conventional art.
Figure 2:
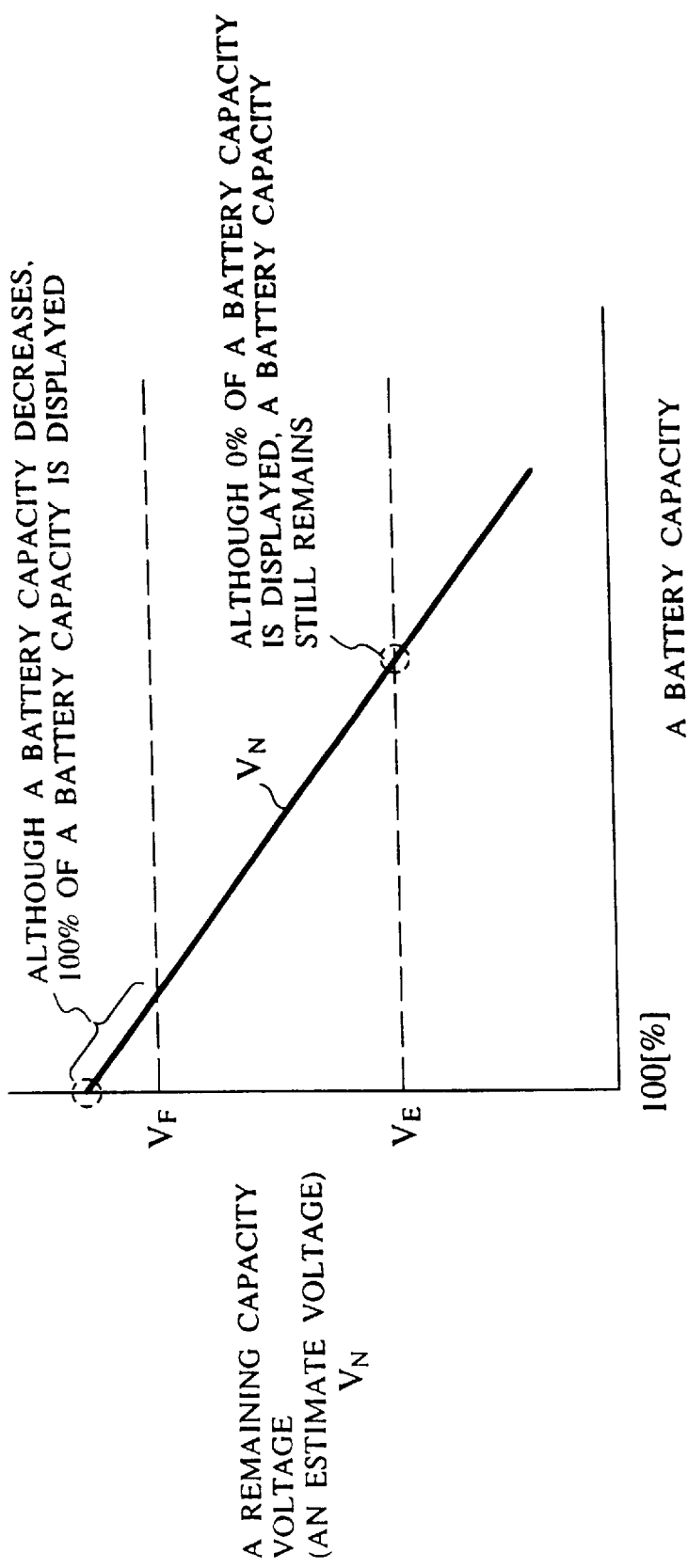
FIG. 2 is a diagram showing the problems of a conventional art.
Figure 3:
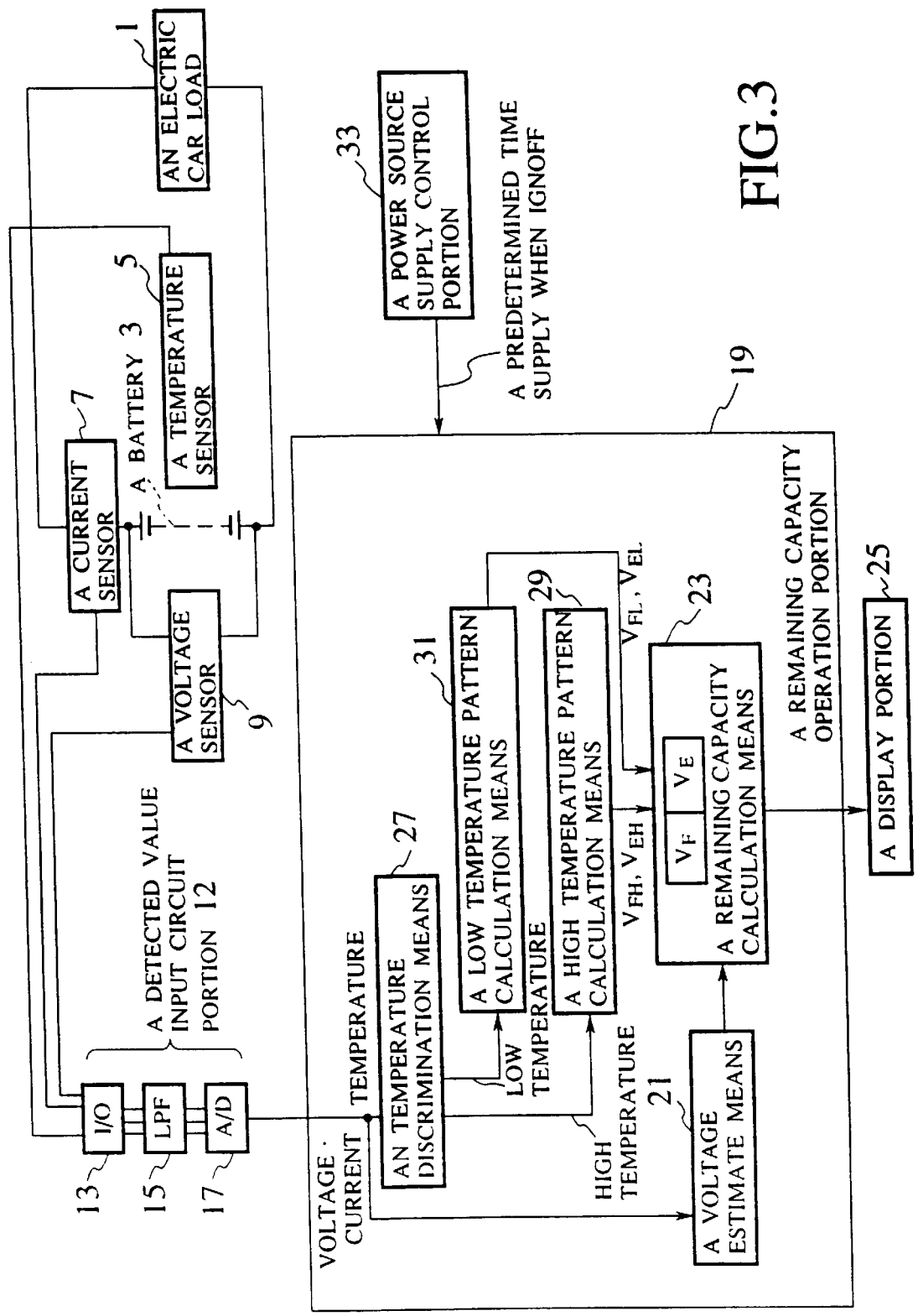
FIG. 3 shows a schematic configuration according to the invention.

FIG. 3 shows a schematic configuration of a battery remaining capacity measuring apparatus according to embodiments of the invention. In FIG. 3, a numeral 1 denotes an electric car load (for example, a motor) connected to a battery 3. A numeral 5 denotes a temperature sensor installed in a battery 3. A numeral 7 denotes a current sensor which detects a current passing through an electric car load (as referred to as a load below). A numeral 9 denotes a voltage sensor which detects a terminal voltage in a battery 3.

A numeral 12 denotes a detected value input circuit. The detected value input circuit comprises I/O port 13, low-pass filter (LPF) 15 and A/D converter 17, where a temperature signal of a battery 3 from a temperature 5, a voltage sensor 9 and a current sensor 7 and a discharge current signal and a detected voltage signal of a battery 3 are inputted. A noise of these signals are eliminated and converted to digital.

A numeral 19 denotes a remaining capacity operation portion. A program configuration of a remaining capacity operation portion comprises a voltage estimate means 21, a remaining capacity calculation means 23, a temperature discrimination means 27, a high temperature pattern calculation means 29 and a low temperature pattern calculation means 31.

The voltage estimate means 21 inputs a digital detected current and voltage of a battery 3 from a detected value input circuit 12, and samples a detected current and a detected voltage for every 1 ms. Each data is standardized for every 100 ms, and then an error of a plurality of voltage values and current values is squared and summed. The values of a and b are found in order to minimize an error. A voltage—current approximate linear function (Y=aX+b) is obtained according to the a and the b. A point on a voltage—current approximate linear function corresponding to a reference current value is determined as a terminal voltage of a battery 3 (an estimate voltage $V_N$).

When an electric car stops running, an ignition is changed to off and a battery 3 is not connected to a load 1. Then, a remaining capacity calculation portion 23 sets a current of a battery 3 to a maximum voltage after a predetermined time (when a battery 3 is changed to an open circuit voltage). A minimum voltage is set when a remaining capacity is 0% according to this maximum voltage, and a line pattern connecting both of voltage values is generated and is set to an internal register.

Furthermore, when a battery is connected to a load, an estimate voltage is located on a line pattern. A remaining capacity is obtained and is displayed in a display portion 25.

The maximum voltage is set at a full-charged voltage $V_F$, while the minimum voltage is set at a voltage $V_E$ when a 0% of a remaining capacity remains according to this full-charged voltage $V_F$.

Figure 4:
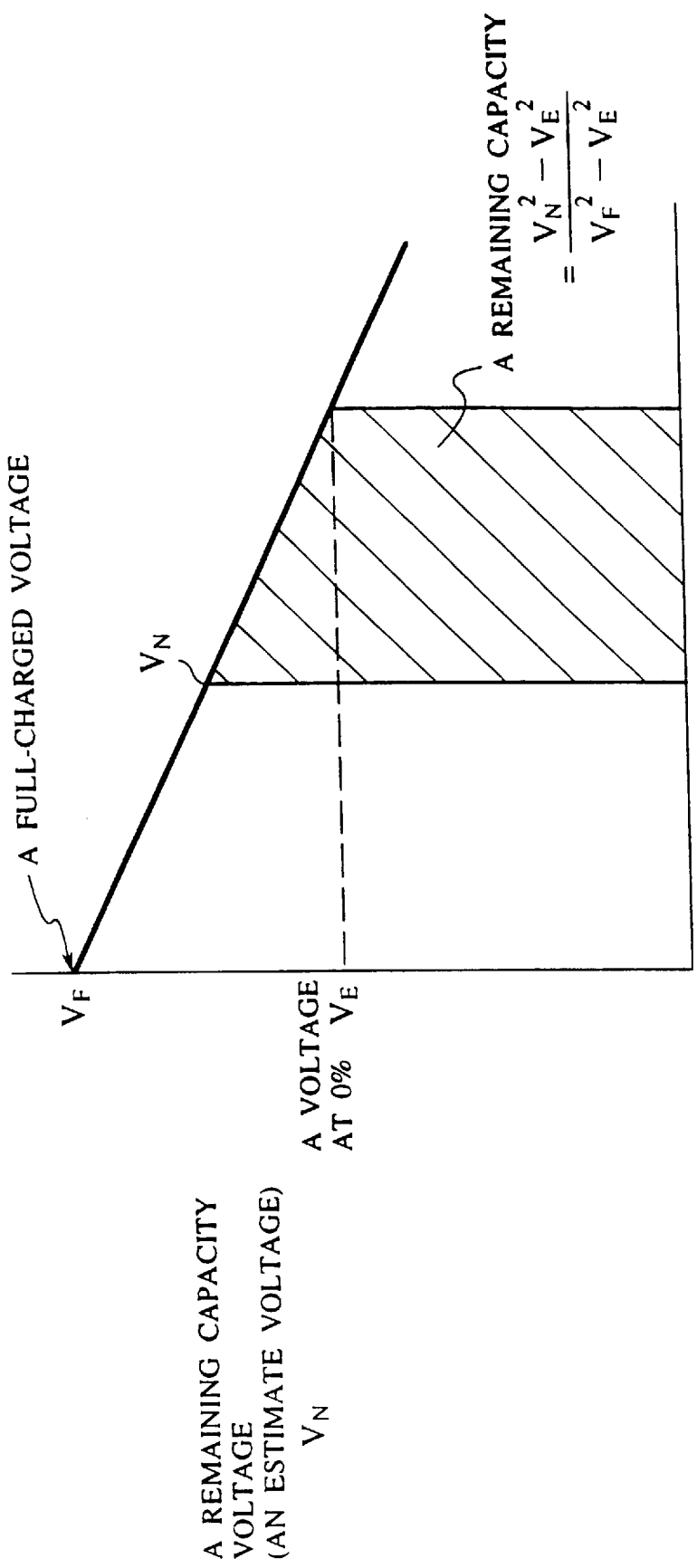
FIG. 4 is a diagram showing a calculation of a remaining capacity.

As shown in FIG. 4, a remaining capacity shown in a slant line portion is substituted in the following equation in order to obtain a remaining capacity.

$$(V_N^2 - V_E^2)/(V_F^2 - V_E^2) \tag{1}$$

That is, an estimate voltage $V_N$ is located on a line pattern. A remaining capacity comprising the estimate voltage $V_N$ and a minimum voltage (a voltage when 0% of remaining capacity remains) is subtracted from a remaining capacity between a maximum voltage (a full-charged voltage $V_F$) of a line pattern and a minimum voltage.

A temperature discrimination means 27 inputs temperature data from a detected value input circuit portion 12 when an ignition is changed to OFF and a predetermined time passes. The temperature discrimination means 27 discriminates whether this temperature data is within the range of a predetermined temperature or not. When the temperature data is less than the range of a predetermined temperature (a low temperature), a low temperature pattern calculation means 31 operates. When the temperature data is more than the range of a predetermined temperature (a high temperature), a high temperature pattern calculation means 29 operates.

Figure 5:
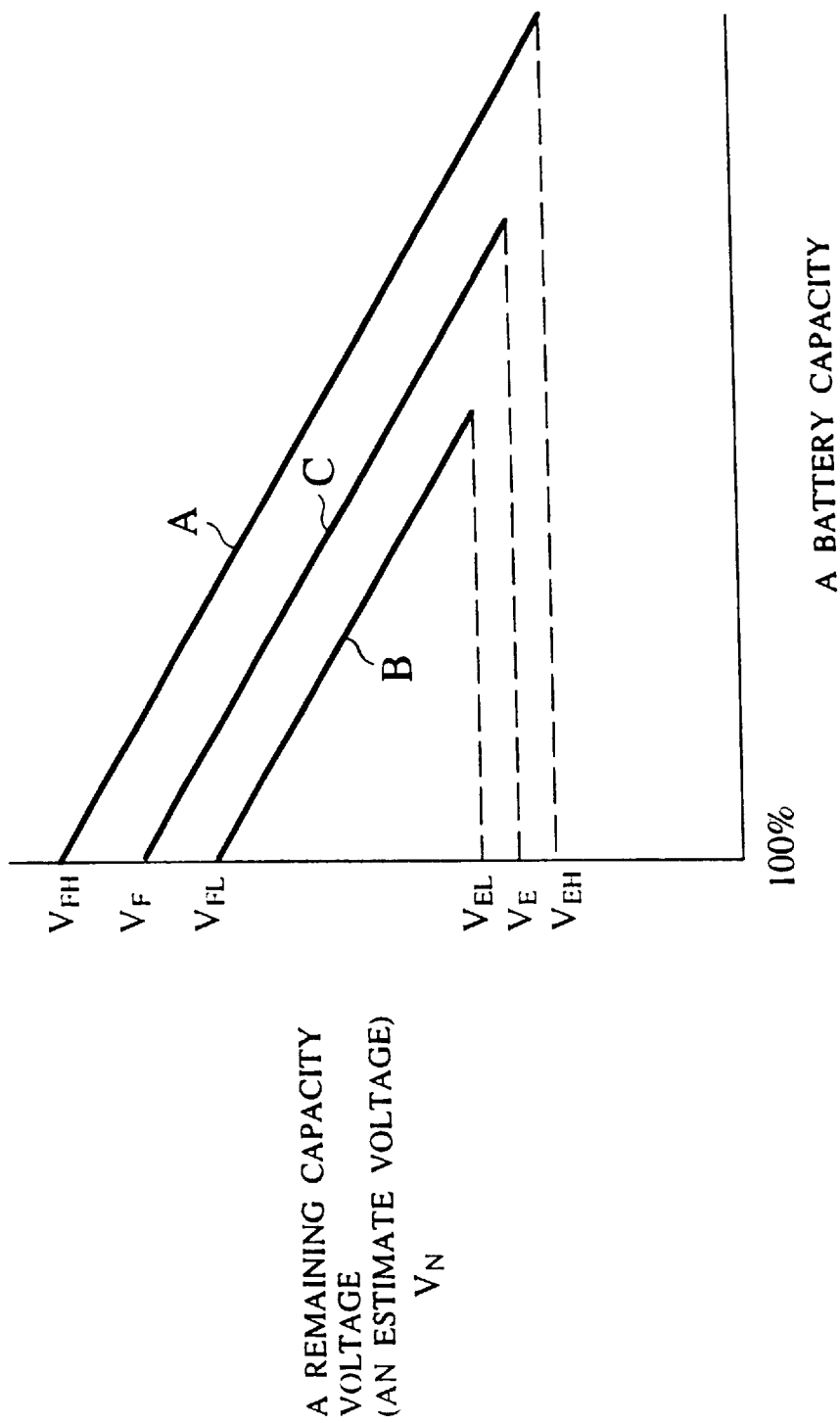
FIG. 5 is a diagram showing a correction of a line pattern according to the invention.

When a temperature data is a high temperature, a high temperature pattern calculating means 29 changes a full-charged voltage $V_F$ stored in a remaining capacity calculation means 23 into a new full-charged voltage for high temperature $V_{FH}$, which can be obtained by adding a first predetermined correct value to the full-charged voltage $V_F$. In addition, the high temperature pattern calculating means 29 changes an empty voltage $V_E$ in case of 0% in remaining capacity into a new empty voltage for high temperature $V_{EH}$, which can be obtained by subtracting a second predetermined correct value from the empty voltage $V_E$. Accordingly, as shown in FIG. 5, a line pattern A can be obtained, where a voltage of a battery 3 is inclined to get higher when a temperature gets higher.

According to the correction, a full-charged voltage $V_{FH}$ at a high temperature can be obtained by the following equation;

$$V_{FH}=V_F+\alpha_2 f|T-25°\ C.| \qquad (2)$$

where $\alpha_2 f|T-25°\ C.|$: a correct value at a high temperature.

A voltage $V_{EH}$ when 0% of a remaining capacity remains at a high temperature can be obtained by the following equation;

$$V_{EH}=V_E-\alpha_2 e|T-25°\ C.| \qquad (3)$$

where $\alpha_2 e|T-25°\ C.|$: a correct value when 0% of a remaining capacity at a high temperature.

When a temperature data is a low temperature, a low temperature pattern calculating means 31 changes the full-charged voltage $V_F$ in the remaining capacity calculation means 23 into a new full-charged voltage for low temperature $V_{FL}$, which can be obtained by subtracting a third predetermined correct value from the full-charged voltage $V_F$. In addition, the low temperature pattern calculating means 31 changes the empty voltage $V_E$ in case of 0% in remaining capacity into a new empty voltage for high temperature $V_{EL}$, which can be obtained by adding a fourth predetermined correct value into the empty voltage $V_E$. Accordingly, as shown in FIG. 5, a line pattern B can be obtained, where a voltage of a battery 3 is inclined to get lower when a temperature gets lower.

According to the correction, a full-charged voltage $V_{FL}$ at a low temperature can be obtained by the following equation;

$$V_{FL}=V_{FL}-\alpha_1 f|T-25°\ C.| \qquad (4)$$

where $\alpha_1 f|T-25°\ C.|$: a correct value at a low temperature.

A voltage $V_{EL}$ when 0% of a remaining capacity remains at a low temperature can be obtained by the following equation;

$$V_{EL}=V_E+\alpha_1 e|T-25°\ C.| \qquad (5)$$

where $\alpha_1 e|T-25°\ C.|$: a correct value when 0% of a remaining capacity at a low temperature.

A numeral 33 denotes a power source supply control portion. When an ignition is OFF, a power source supply control portion 33 provides a predetermined time power source. Thereby, a remaining capacity calculation means 23 reads a terminal voltage when a battery 3 reaches an open circuit voltage. Accordingly, a voltage $V_f$ and a voltage $V_{EL}$ are decided in order to calculate a line pattern.

Thus, if a battery 3 is not connected to a load 1, a battery 3 changes into an open circuit voltage slowly not immediately. Accordingly, when an ignition is OFF and a load is not connected to a battery 3, a predetermined time power source is provided in order to detect an open circuit voltage when an ignition is OFF.

Figure 6:
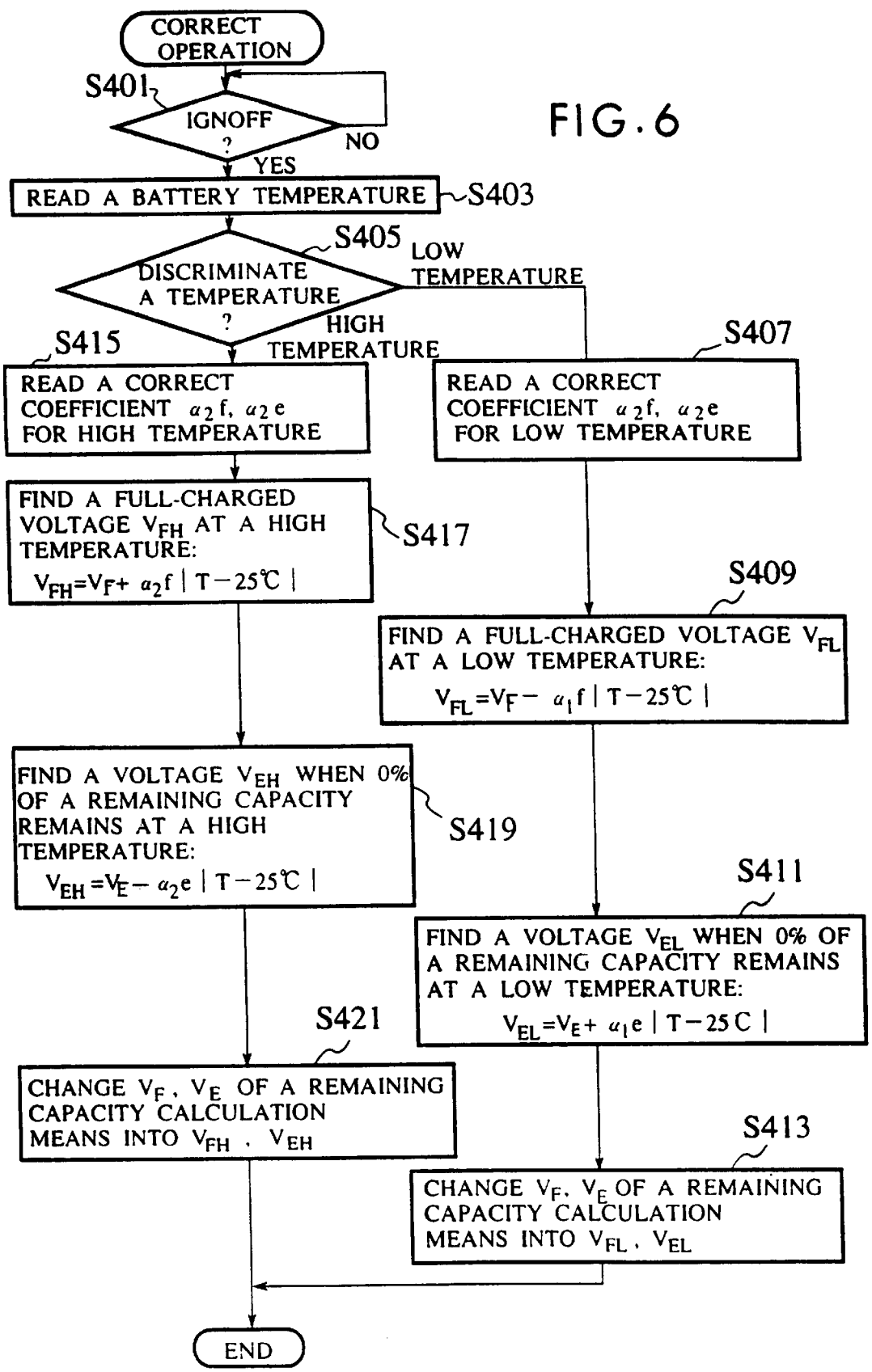
FIG. 6 is a flow chart showing a correct operation according to the invention.

According to a battery remaining capacity measuring apparatus described above, an operation of the temperature discrimination means 27, the high temperature pattern calculation means 29 and the low temperature pattern calculation means 31 (generally, as refereed a correct operation below) is explained using a flow chart of FIG. 6.

The temperature discrimination means 27 discriminates whether an ignition is OFF or not (S401). Next, when an ignition is OFF, temperature data is read after a predetermined time passes (S403) and whether this temperature is low or high is decided (S405). A remaining capacity calculation means 23 changes an actual voltage of a battery 3 into a maximum voltage when a battery 3 is not connected to a load 1. According to this maximum voltage, a minimum voltage is obtained and set when a remaining capacity is 0%. Then, a line pattern connecting both of voltage values is generated and stored. According to the embodiment of the present invention, a maximum voltage is a full-charged voltage $V_F$.

Next, when the temperature is low, a low temperature pattern calculation means 31 reads a correction coefficient $\alpha_1 f$ and $\alpha_1 e$ for the predetermined low temperature (S407), substitutes these correction coefficients in an equation (6) and obtains a full-charged voltage $V_{FL}$ at a low temperature shown in FIG. 5 (S409).

Next, a full-charged voltage $V_{FL}$ at a low temperature can be obtained by the following equation;

$$V_{FL}=V_F-\alpha_1 f|T-25°\ C.| \qquad (6)$$

Next, a voltage $V_{EL}$ is substituted in an equation (7) when a remaining capacity is 0% at a low temperature (S411).

$$V_{EL}=V_E-\alpha_1 e|T-25°\ C.| \qquad (7)$$

Next, the low temperature calculation means 31 changes a full-charged voltage $V_F$ at a usual temperature and a voltage $V_E$ at 0% of a remaining capacity, respectively, into a full-charged voltage $V_{FL}$ and a voltage $V_{EL}$ at 0% of a remaining capacity (S413). Where, a full-charged voltage $V_F$ and a voltage $V_E$ is previously set by the remaining capacity calculation means 23, and a full-charged voltage $V_{FL}$ and a voltage $V_{EL}$ can be obtained by equations (6) and (7). Then, the operation is completed.

Since the remaining capacity calculation means 23 corrects a line pattern C according to a full-charged voltage $V_{FL}$ at a low temperature and a voltage $V_{EL}$ at 0% of a remaining capacity at a low temperature, a line pattern B can be obtained as shown in FIG. 5. That is, an obtained line pattern B has a tendency that a battery voltage gets lower when a battery temperature is low.

Next, when a battery 3 is connected to a load 1, an estimate voltage $V_N$ is located on a line pattern B. As shown in FIG. 4, a remaining capacity in a slant line part is substituted in the following equation and is obtained.

$$(V_N{}^2-V_E{}^2)/(V_F{}^2-V_E{}^2) \qquad (8)$$

It is possible to obtain a correct remaining capacity at a low temperature easily. Accordingly, if 100% of a capacity of a battery 3 remains, less than 100% of a remaining capacity is not displayed, while if no capacity of a battery remains, more than 0% of a remaining capacity is not displayed.

Furthermore, when S405 decides a high temperature, S415 reads predetermined correct coefficients $\alpha_2 f$ and $\alpha_2 e$ for a high temperature. These correct coefficients are substituted in the following equation and $V_{FH}$ at a high temperature can be obtained (S417).

$$V_{FH}=V_F+\alpha_2 f|T-25°\ C.| \qquad (9)$$

Next, when a remaining capacity is 0% at a high temperature, a voltage $V_{EH}$ is substituted in the following equation and can be obtained (S419).

$$V_{EH}=V_E-\alpha_2 e|T-25°\ C.| \qquad (10)$$

Next, the high temperature calculation means 29 changes a full-charged voltage $V_F$ at a usual temperature and a voltage $V_E$ at 0% of a remaining capacity, respectively, into a full-charged voltage $V_{FH}$ at a high temperature and a voltage $V_{EH}$ at 0% of a remaining capacity at a high temperature (S421). Where a full-charged voltage $V_F$ and a voltage $V_E$ are previously set by the remaining capacity calculation means 23, and a full-charged voltage $V_{FL}$ and a voltage $V_{EL}$ can be obtained by equations (9) and (10). Then, the operation is completed.

Since the remaining capacity calculation means 23 corrects a line pattern C according to a full-charged voltage $V_{FH}$ at a high temperature and a voltage $V_{EH}$ at 0% of a remaining capacity at a high temperature, a line pattern A can be obtained shown in FIG. 5. That is, an obtained line pattern A has a tendency that a battery voltage gets higher when a battery temperature is high.

Next, when a battery 3 is connected to a load 1, an estimate voltage $V_N$ is located on a line pattern A. As shown in FIG. 4, a remaining capacity in a slant line part is substituted in the following equation and is obtained.

$$(V_N{}^2-V_E{}^2)/(V_F{}^2-V_E{}^2) \qquad (11)$$

Accordingly, when a battery temperature is high, if less than 100% of a capacity of a battery 3 remains actually, 100% of a remaining capacity is not displayed.

While, if a capacity of a battery still remains, 0% of a remaining capacity is not displayed.

Although a remaining capacity measuring apparatus used on an electric car is explained according to the above mentioned embodiment, it is possible to use it in an apparatus which a battery temperature changes sharply.

What is claimed is:

1. An apparatus for determining a remaining capacity on a battery to be connected to a load in a circuit, said apparatus comprising:

a voltage sensor for detecting a voltage value of said battery;

a current sensor for detecting a current value flowing in said load in a closed condition of said circuit where said battery is electrically connected to said load;

a temperature sensor for sensing a temperature of said battery;

a voltage estimate unit for estimating a present battery voltage (Vn) corresponding to a standard current value in accordance with a voltage-current approximate linear function which can be obtained by a plurality of voltage values and current values detected by said voltage sensor and said current sensor in the closed condition of said circuit;

a remaining capacity calculation unit for calculating the remaining capacity corresponding to the present battery voltage (Vn) in accordance with a line pattern (C) between a maximum voltage ($V_F$) and a minimum voltage ($V_E$), said maximum voltage corresponding to a battery voltage detected by said voltage sensor in an opened condition of said circuit where said battery is disconnected with said load, said minimum voltage corresponding to another battery voltage in case of 0% in remaining capacity in accordance with said maximum voltage;

a temperature discriminating unit discriminating whether the sensed temperature is within a predetermined temperature range or is less than or greater than the predetermined temperature range;

a high temperature pattern calculation unit of replacing the line pattern of said remaining capacity calculation unit with a high temperature line pattern (A) when the sensed temperature is greater than the predetermined temperature range; and a low temperature pattern calculation unit for replacing the line pattern with a low temperature line pattern (B) when the sensed temperature is less than the predetermined temperature range;

wherein said high temperature line pattern (A) is between a maximum voltage for high temperature ($V_{FH}$), which is obtained by adding a first correction value to the maximum voltage ($V_F$) at said high temperature calculation pattern calculation unit, and a minimum voltage for high temperature ($V_{EH}$), which is obtained by subtracting a second correction value from the minimum voltage ($V_E$) of the line pattern (C) at said high temperature pattern calculation unit; and said low temperature line pattern (B) is between a maximum voltage for low temperature ($V_{FL}$), which is obtained by subtracting a third correction value from the maximum voltage ($V_F$) at said low temperature pattern calculation unit, and a minimum voltage for low temperature ($V_{EL}$), which is obtained by adding a fourth correction value to the minimum voltage ($V_E$) of the line pattern (C) at said low temperature pattern calculation unit.

2. An apparatus of claim 1, wherein the maximum voltage is a battery terminal voltage detected by said voltage sensor after a predetermined time has passed since said load was electrically disconnected with said battery.

3. An apparatus of claim 2, wherein the maximum voltage is a battery terminal voltage detected by said voltage sensor when said battery is in a state of full-charging.

\* \* \* \* \*

UNITED STATES PATENT AND TRADEMARK OFFICE
CERTIFICATE OF CORRECTION

PATENT NO. : 5,872,453
DATED : February 16, 1999
INVENTOR(S) : Kenichi SHIMOYAMA, et al.

It is certified that error appears in the above-identified patent and that said Letters Patent is hereby corrected as shown below:

On the title page, item [75], the 2nd inventor's name is misspelled. It should be:

--Tsutomu SAIGO--

Signed and Sealed this

Fourteenth Day of March, 2000

*Attest:*

Q. TODD DICKINSON

*Attesting Officer*      *Commissioner of Patents and Trademarks*

UNITED STATES PATENT AND TRADEMARK OFFICE
CERTIFICATE OF CORRECTION

PATENT NO. : 5,872,453
DATED : February 16, 1999
INVENTOR(S) : Shimoyama, et al.

Page 1 of 1

It is certified that error appears in the above-identified patent and that said Letters Patent is hereby corrected as shown below:

Column 1,
Line 46, change "refereed" to -- referred --.

Column 4,
Line 34, change "reference" to -- standard --.

Column 6,
Line 6, change "$V_f$" to -- $V_F$ --.
Line 33, change "a" to -- the --.
Line 33, change "the" to -- a --.

Signed and Sealed this

Ninth Day of October, 2001

Attest:

NICHOLAS P. GODICI
Attesting Officer
Acting Director of the United States Patent and Trademark Office